(12) United States Patent
Kamgaing et al.

(10) Patent No.: US 11,335,651 B2
(45) Date of Patent: May 17, 2022

(54) MICROELECTRONIC DEVICES DESIGNED WITH COMPOUND SEMICONDUCTOR DEVICES AND INTEGRATED ON AN INTER DIE FABRIC

(71) Applicant: Intel Corporation, Santa Clara, CA (US)

(72) Inventors: Telesphor Kamgaing, Chandler, AZ (US); Georgios C. Dogiamis, Chandler, AZ (US); Vijay K. Nair, Mesa, AZ (US); Javier A. Falcon, Chandler, AZ (US); Shawna M. Liff, Scottsdale, AZ (US); Yoshihiro Tomita, Ibaraki (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/773,033

(22) PCT Filed: Dec. 22, 2015

(86) PCT No.: PCT/US2015/000160
§ 371 (c)(1),
(2) Date: May 2, 2018

(87) PCT Pub. No.: WO2017/111769
PCT Pub. Date: Jun. 29, 2017

(65) Prior Publication Data
US 2018/0240762 A1    Aug. 23, 2018

(51) Int. Cl.
*H01L 23/66* (2006.01)
*H01L 23/48* (2006.01)
(Continued)

(52) U.S. Cl.
CPC .............. *H01L 23/66* (2013.01); *H01L 23/48* (2013.01); *H01L 23/49816* (2013.01);
(Continued)

(58) Field of Classification Search
CPC ... H01L 25/16; H01L 23/66; H01L 23/49827; H01L 23/48; H01L 2924/18161;
(Continued)

(56) References Cited

U.S. PATENT DOCUMENTS

| 6,476,463 B1 * | 11/2002 | Kaneko | H01L 23/552 |
| | | | 257/660 |
| 6,686,649 B1 * | 2/2004 | Mathews | H01L 23/552 |
| | | | 257/659 |

(Continued)

FOREIGN PATENT DOCUMENTS

| CN | 103972226 | 8/2014 |
| CN | 104078451 | 10/2014 |

(Continued)

OTHER PUBLICATIONS

International Preliminary Report on Patentability for PCT Patent Application No. PCT/US2015/000160 dated Jul. 5, 2018, 9 pgs.

(Continued)

*Primary Examiner* — Ahmed N Sefer
(74) *Attorney, Agent, or Firm* — Schwabe, Williamson & Wyatt, P.C.

(57) ABSTRACT

Embodiments of the invention include a microelectronic device that includes a first silicon based substrate having compound semiconductor components. The microelectronic device also includes a second substrate coupled to the first substrate. The second substrate includes an antenna unit for transmitting and receiving communications at a frequency of approximately 4 GHz or higher.

14 Claims, 5 Drawing Sheets

(51) Int. Cl.
| | |
|---|---|
| *H01L 23/538* | (2006.01) |
| *H01L 23/00* | (2006.01) |
| *H01L 23/498* | (2006.01) |
| *H01L 23/552* | (2006.01) |
| *H01L 25/10* | (2006.01) |
| *H01L 25/16* | (2006.01) |

(52) U.S. Cl.
CPC .... *H01L 23/49827* (2013.01); *H01L 23/5384* (2013.01); *H01L 23/552* (2013.01); *H01L 24/00* (2013.01); *H01L 25/105* (2013.01); *H01L 25/16* (2013.01); *H01L 2223/6672* (2013.01); *H01L 2223/6677* (2013.01); *H01L 2224/16227* (2013.01); *H01L 2224/16265* (2013.01); *H01L 2924/15153* (2013.01); *H01L 2924/15159* (2013.01); *H01L 2924/15192* (2013.01); *H01L 2924/15321* (2013.01); *H01L 2924/18161* (2013.01); *H01L 2924/19011* (2013.01); *H01L 2924/19041* (2013.01); *H01L 2924/19042* (2013.01); *H01L 2924/19043* (2013.01); *H01L 2924/19103* (2013.01); *H01L 2924/19104* (2013.01)

(58) Field of Classification Search
CPC ... H01L 2223/6677; H01L 2924/19104; H01L 2223/6672; H01L 2924/15159; H01L 2224/16265; H01L 2224/16227; H01L 2924/15153; H01L 2924/15192; H01L 2924/15321; H01L 2924/19011; H01L 2924/19041; H01L 2924/19042; H01L 2924/19043; H01L 2924/19103
See application file for complete search history.

(56) References Cited

U.S. PATENT DOCUMENTS

| | | | | |
|---|---|---|---|---|
| 9,673,173 | B1* | 6/2017 | Li | H01L 23/5384 |
| 2003/0112576 | A1* | 6/2003 | Brewer | G03F 7/0002 |
| | | | | 361/119 |
| 2005/0088260 | A1* | 4/2005 | Ajioka | H01L 23/552 |
| | | | | 333/247 |
| 2007/0063056 | A1* | 3/2007 | Gaucher | H01L 23/4334 |
| | | | | 235/492 |
| 2007/0290326 | A1* | 12/2007 | Yang | |
| 2008/0029886 | A1* | 2/2008 | Cotte | H01L 24/24 |
| | | | | 257/728 |
| 2011/0032685 | A1 | 2/2011 | Akiba et al. | |
| 2011/0147920 | A1* | 6/2011 | Choudhury | H01L 23/3677 |
| | | | | 257/712 |
| 2011/0148545 | A1* | 6/2011 | Choudhury | H01L 23/66 |
| | | | | 333/185 |
| 2011/0149519 | A1* | 6/2011 | Choudhury | H05K 1/0236 |
| | | | | 361/707 |
| 2011/0180811 | A1* | 7/2011 | Suzuki | G06K 19/07745 |
| | | | | 257/77 |
| 2011/0180917 | A1* | 7/2011 | Tang | H01L 23/041 |
| | | | | 257/684 |
| 2011/0291111 | A1* | 12/2011 | Nagai | H01L 23/10 |
| | | | | 257/77 |
| 2012/0146240 | A1* | 6/2012 | Dairiki | H01L 21/6835 |
| | | | | 257/777 |
| 2012/0275117 | A1* | 11/2012 | Choudhruy | H01L 24/19 |
| | | | | 361/720 |
| 2013/0009320 | A1 | 1/2013 | Yoo et al. | |
| 2014/0028518 | A1* | 1/2014 | Arnold | H01Q 1/526 |
| | | | | 343/841 |
| 2014/0035114 | A1 | 2/2014 | Gogoi | |
| 2014/0057393 | A1* | 2/2014 | Bonart | H01L 24/94 |
| | | | | 438/113 |
| 2014/0110840 | A1* | 4/2014 | Wojnowski | H01Q 23/00 |
| | | | | 257/738 |
| 2014/0110841 | A1 | 4/2014 | Beer et al. | |
| 2014/0145884 | A1 | 5/2014 | Dang et al. | |
| 2014/0209926 | A1* | 7/2014 | Takatani | H01L 23/66 |
| | | | | 257/77 |
| 2014/0266947 | A1* | 9/2014 | Chen | H01Q 1/2283 |
| | | | | 343/772 |
| 2014/0293529 | A1* | 10/2014 | Nair | H01Q 1/2291 |
| | | | | 361/679.31 |
| 2015/0287672 | A1* | 10/2015 | Yazdani | H01L 23/49838 |
| | | | | 257/414 |

FOREIGN PATENT DOCUMENTS

| | | |
|---|---|---|
| JP | 2996169 | 12/1999 |
| TW | 200713617 | 4/2007 |

OTHER PUBLICATIONS

International Search Report and Written Opinion for International Patent Application No. PCT/US2015/000160 dated Sep. 20, 2016, 12 pgs.
Office Action from Taiwan Patent Application No. 105137843 dated Jul. 10, 2020, 14 pgs.
Office Action from Taiwan Patent Application No. 105137843 dated Feb. 21, 2020, 11 pgs.
Office Action from Taiwan Patent Application No. 105137843 dated Dec. 16, 2021, 13 pgs.
A. Eblabla, X. Li, I. Thayne, D. J. Wallis, I. Guiney, and K. Elgaid, "High Performance GaN High Electron Mobility Transistors on Low Resistivity Silicon for X-Band Applications," IEEE Electron Device Letters, Jul. 23, 2015. vol. 36, No. 9, pp. 899-901.
Office Action for Chinese Patent Application No. 201580084754.2 dated Jul. 1, 2021, 13 pgs., no translation.
Office Action from Taiwan Patent Application No. 105137843 dated Jun. 17, 2021, 15 pgs.
Office Action from Taiwan Patent Application No. 105137843 dated Jan. 15, 2022, 16 pgs.

* cited by examiner

MICROELECTRONIC DEVICES DESIGNED WITH COMPOUND SEMICONDUCTOR DEVICES AND INTEGRATED ON AN INTER DIE FABRIC

CROSS-REFERENCE TO RELATED APPLICATION

This patent application is a U.S. National Phase Application under 35 U.S.C. § 371 of International Application No. PCT/US2015/000160, filed Dec. 22, 2015, entitled "MICROELECTRONIC DEVICES DESIGNED WITH COMPOUND SEMICONDUCTOR DEVICES AND INTEGRATED ON AN INTER DIE FABRIC," which designates the United States of America, the entire disclosure of which is hereby incorporated by reference in its entirety and for all purposes.

FIELD OF THE INVENTION

Embodiments of the present invention relate generally to the manufacture of semiconductor devices. In particular, embodiments of the present invention relate to microelectronic devices having compound semiconductor devices integrated on an inter diefabric.

BACKGROUND OF THE INVENTION

Future wireless products are targeting operation frequencies much higher than the lower GHz range utilized presently. For instance 5G ($5^{th}$ generation mobile networks or $5^{th}$ generation wireless systems) communications is expected to operate at a frequency greater than or equal to 15 GHz. Moreover, the current WiGig (Wireless Gigabit Alliance) products operate at 60 GHz. Other applications including automotive radar and medical imaging, utilize wireless communication technologies in the millimeter wave frequencies (e.g., 30 GHz-300 GHz). For these wireless applications, the designed RF (radio frequency) circuits are in need of high quality matching passive networks, in order to accommodate the transmission of pre-defined frequency bands (where the communication takes place) as well as in need of high efficiency power amplifiers and low loss power combiners/switches.

DETAILED DESCRIPTION OF THE INVENTION

Figure 1:
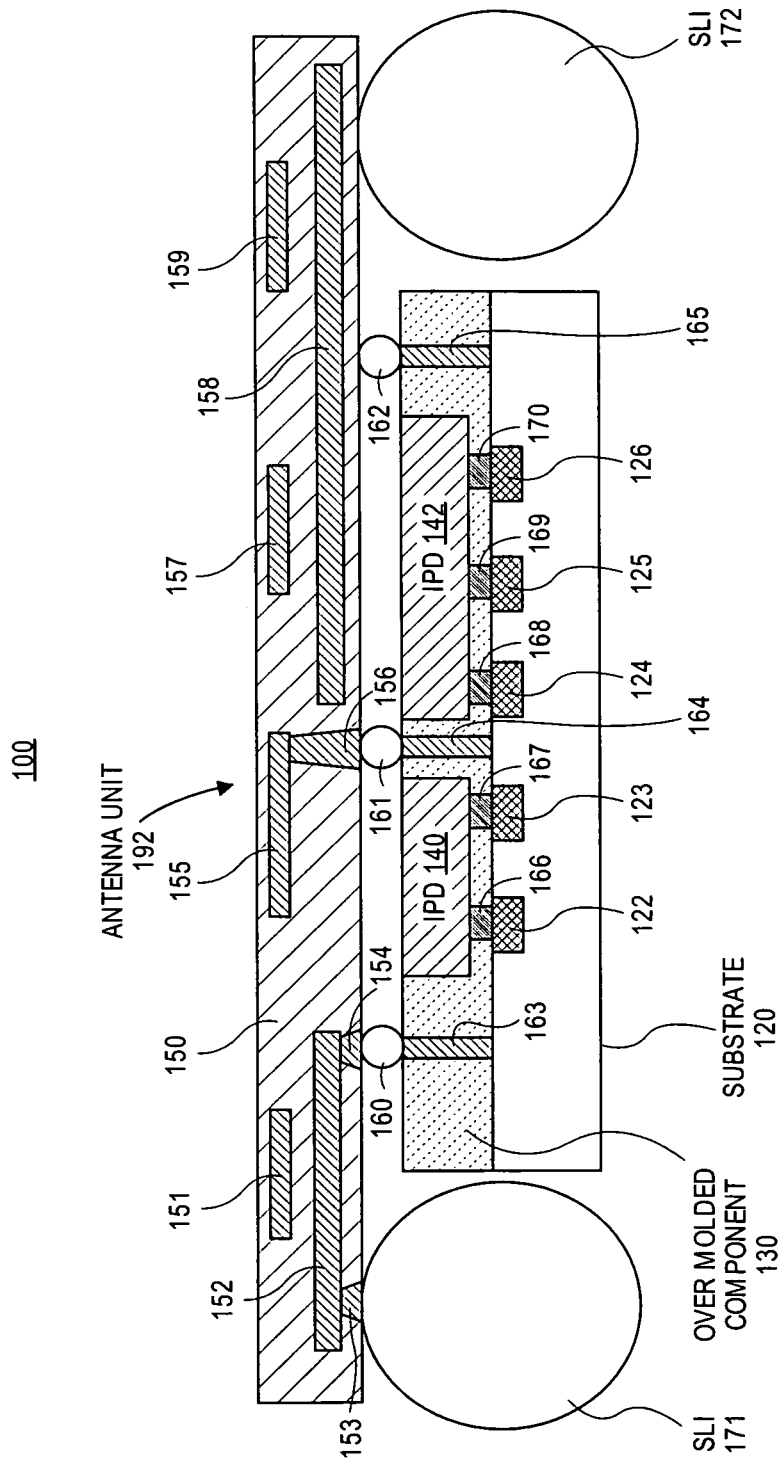
FIG. 1 illustrates co-integrating different components in a microelectronic device (e.g., an inter die fabric architecture) in accordance with one embodiment.

Described herein are microelectronic devices that are designed with compound semiconductor devices integrated in a silicon based substrate of an inter die fabric. In the following description, various aspects of the illustrative implementations will be described using terms commonly employed by those skilled in the art to convey the substance of their work to others skilled in the art. However, it will be apparent to those skilled in the art that embodiments of the present invention may be practiced with only some of the described aspects. For purposes of explanation, specific numbers, materials and configurations are set forth in order to provide a thorough understanding of the illustrative implementations. However, it will be apparent to one skilled in the art that embodiments of the present invention may be practiced without the specific details. In other instances, well-known features are omitted or simplified in order to not obscure the illustrative implementations.

Various operations will be described as multiple discrete operations, in turn, in a manner that is most helpful in understanding embodiments of the present invention, however, the order of description should not be construed to imply that these operations are necessarily order dependent. In particular, these operations need not be performed in the order of presentation.

For high frequency (e.g., 5G, WiGig) wireless applications of millimeter (e.g., 1-10 mm, any mm wave) wave communication systems, the designed RF circuits (e.g., low-noise amplifiers, mixers, power amplifiers, switches, etc.) are in need of high quality passive matching networks, in order to accommodate the transmission of pre-defined frequency bands where the communication takes place as well as in need of high efficiency power amplifiers, and low loss, power combiners/switches, etc. CMOS technology for greater than 15 GHz operation can be utilized, but with decreased power amplifier efficiencies and with low quality factor passives, mainly due to the typically lossy silicon substrate employed. This results not only in a lower system performance, but also in increased thermal requirements due to the excess heat generated. In one example, the high thermal dissipation is due to the fact that multiple power amplifiers have to be utilized in a phased array arrangement to achieve the desired output power and transmission range. This will be even more stringent on 5G systems as the typical transmission range for cellular network (e.g., 4G, LTE, LTE-Adv) is several times larger than that required for connectivity (e.g., WiFi, WiGig).

The present design includes high frequency components (e.g., 5G transceiver) and utilizes non-CMOS technologies (e.g., non-silicon substrates) for critical parts of a communication system (e.g., GaAs, GaN, Passives-on-Glass, etc.). Critical parts requiring high efficiencies and high quality factors can be fabricated on another technology (e.g., compound semiconductor materials, group III-V materials). These parts might be either on device level (e.g., transistors on GaN/GaAs) or on circuit level (e.g., III-V die integrating a power amplifier, a low noise amplifier, etc.) and integrated with silicon based substrates. The full communication system will be formed in a package-fabric manner, as discussed in embodiments of this invention.

The present design technology allows co-integrating dies and/or devices that are fabricated on different technologies and/or substrates on the same package for performance enhancement and relaxation of thermal requirements. The package might include antenna units for communication with other wireless systems.

In one embodiment, the present design is a 5G ($5^{th}$ generation mobile networks or $5^{th}$ generation wireless systems) architecture having non-CMOS based transceiver building blocks (e.g., group III-V based devices or dies, GaN islands) that are co-integrated on the same package with low frequency circuits and integrated passive devices (IPDs) for performance enhancement and thermal requirements relaxation. In this arrangement, each component is integrated assembled directly in the package. The package may have antennas directly integrated onto it. The 5G architecture operates at a high frequency (e.g., at least 20 GHz, at least 25 GHz, at least 28 GHz, at least 30 GHz, etc.) and may also have approximately 1-50 gigabits per second (Gbps) connections to end points. In another example, the present design operates at lower frequencies (e.g., at least 4 GHz, approximately 4 GHz).

The design of this 5G architecture provides optimized performance for high frequency transceivers based on using compound semiconductor materials for certain components (e.g., switches, power amplifier, mixers) and integrated passive devices or dies (IPDs) for better quality passives. The present design also results in reduced cost due to having a first substrate designed for antenna or antenna components and a second substrate designed for higher frequency components. In one example, the functional testing of transceiver components, which may utilize in-mold-circuits, are decoupled from the need to assemble them initially on the package. Functional blocks such as impedance matching circuits, harmonic filters, couplers, power combiner/divider, etc. can be implemented with IPDs. IPDs are generally fabricated using wafer fab technologies (e.g., thin film deposition, etch, photolithography processing).

In one example, if a high resistivity silicon substrate (e.g., at least 1 ohm cm, at least 10 ohm cm, etc.) is used, then inductors, transformers and transceiver components can be integrated on the same substrate with very good electrical performance. However, a high resistivity substrate is usually not preferred and not cost-effective for integrating digital circuits (e.g., baseband circuitry, application processors, etc.). In another example, if a low resistivity silicon substrate (e.g., less than 1 ohm cm, etc.) is used then high performance digital circuits can be achieved, but most front end passive components (e.g., transformers, inductors) will have very low quality factors. The present design enables 5G SoC with III-V circuits on low resistivity silicon substrate by integrating high performance passives on an anti-die or substrate of integrated passive device (IPD).

In one embodiment, the present design integrates III-V (e.g., GaN) islands having mm-wave active devices on a low resistivity silicon substrate (e.g., less than 1 ohm cm, less than 0.1 ohm cm, less than 0.01 ohm cm, etc.). IPD provides desirable tolerance since semiconductor manufacturing processes are used. Use of low resistivity silicon enables a full implementation of a module from an applications processor to antenna input on a silicon substrate and IPDs. Direct assembly of IPDs on a silicon substrate (e.g., SoC die) removes parasitic inductance and capacitance, which can be very substantial at mm-wave frequencies. In fact for 5G applications, most desired inductors have inductance in the order of picohenries (pH) vs. nanohenries (nH) for low GHz designs. The implementation at mm-wave frequencies enables us to integrate the antenna on the same package with other components (e.g., digital circuitry, applications processor, any processor, baseband circuitry, transceiver, etc.).

FIG. 1 illustrates co-integrating different components in a microelectronic device (e.g., an inter die fabric architecture) in accordance with one embodiment. The microelectronic device 100 (e.g., an inter die fabric architecture 100) includes a substrate 120 and a package substrate 150 having an antenna unit 192. The substrate 120 (e.g., low resistivity silicon substrate having resistivity less than 1 ohm cm, etc.) includes digital circuitry, baseband circuitry, processors, application processors, and at least one transceiver unit. The substrate 120 also includes integrated or embedded compound semiconductor components 122-126 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.). The components 122-126 are integrated to the substrate 120 with semiconductor fabrication processes. For example, these components may be grown monolithically on the substrate 120. In another example, these components may be fabricated with a different process (e.g., GaAs, GaN, etc.) and then attached to the substrate 120 (or embedded within cavities of the substrate) at the beginning, during, or at the end of the processing for the substrate 120 (e.g., CMOS substrate 120). Integrated passive devices or dies (IPDs) 140 and 142 are coupled to the substrate 120 (or components 122-126) with connections 166-170 (e.g., bumps, Cu pillars with solder cap on top, etc.). The IPDs are assembled to the substrate 120 to enable RF front-end functionality as well as digital and analog functionalities. The IPDs may include any type of passives including inductors, transformers, capacitors, and resistors. In one example, capacitors on the IPD die may be used for power delivery. In another example, resistors on the same or a different IPD may be used for digital signal equalization. An overmolded component 130 (e.g., glass, high resistivity silicon, organic substrate, ceramic substrate, alumina substrate, compound semiconductor substrate, etc.) integrates the IPDs on the substrate 120. The component 130 may surround the IPDs completely (e.g., all sides, top, bottom) or may only partially surround (e.g., not above) the IPDs. Components of the substrate 120 including components 122-126 are coupled to the substrate 150 with connections 163-165 (e.g., thru mold connections) and solder balls 160-162. The substrate 150 includes at least one antenna unit 192, conductive layers 151, 152, 155, 156, 157-159, and conductive connections 153, 154, and 156. The conductive layers 151, 155, 157, and 159 may each be antennas 151, 155, 157, and 159 of the antenna unit 192. The components of the substrate 120 and IPDs 140 and 142 can communicate with components of the substrate 150 or other components not shown in FIG. 1 using secondary level interconnect 171 and 172. The connections 163-165 and 160-162 form primary level interconnect.

In general, the IPDs are assembled to substrate 120 (e.g., substrate in which SoC is fabricated) but in some cases the IPDs may be pre-molded prior to the assembly to the substrate 120. If the substrate 120 is smaller than the IPD(s), then the substrate 120 may be assembled on the IPD(s) instead.

The substrate 150 can have a different thickness, length, and width dimensions in comparison to a thickness, length, and width dimensions of the substrate 120.

In one example, components of the substrate 150 which primarily dominate a packaging area are partitioned in a separate lower cost and lower circuit density substrate 150 in comparison to the substrate 120, which may have high density interconnect (HDI) and impedance controlled interconnect. A substrate 150 may be formed with low temperature co-fired ceramic materials, liquid crystal polymers, organic materials, glass, undoped silicon, etc. HDI PCB technologies may include blind and/or buried via processes and possibly microvias with a higher circuit density than traditional PCBs. In this manner, an area of the substrate 120 without antenna components is reduced to lowercost in comparison to a planar structure that includes antenna components. The substrate 120 may be formed with any materials (e.g., low resistivity silicon based substrates, materials for formation of CPUs, Semi-insulating substrate like GaAs, high resistivity silicon substrate, etc.) that are designed for high frequency designs having desirable high frequency characteristics (e.g., substrate loss, dielectric constant).

Additional components such as traditional surface-mount passives may also be mounted to the substrate 120. In addition, the substrate 120 of FIG. 1 may be overmolded and covered with an external shield. The mold material may be a low loss nonconductive dielectric material and the shielding may be made out of a conductive material.

In another embodiment, any of the devices or components can be coupled to each other.

Figure 2:
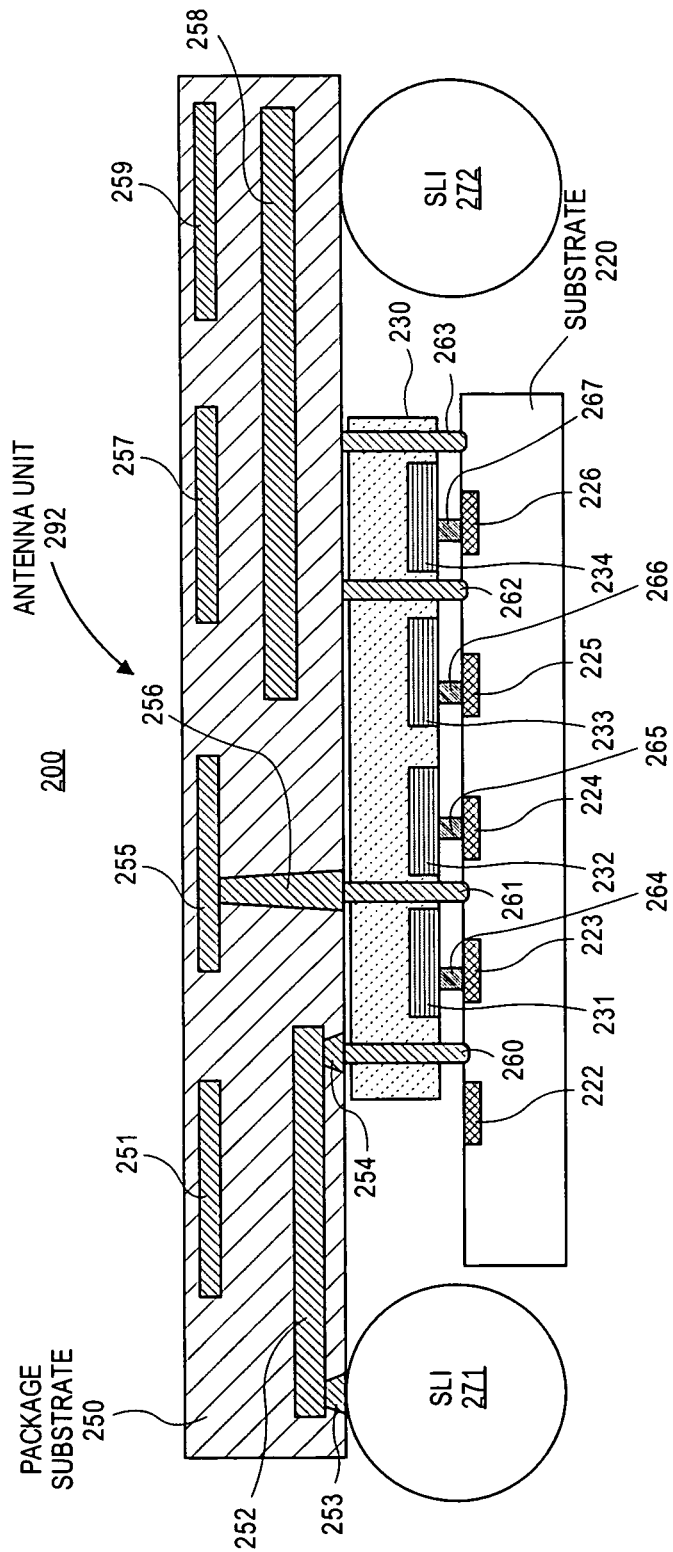
FIG. 2 illustrates co-integrating different components in a partitioned microelectronic device (e.g., an inter die fabric architecture) in accordance with another embodiment.

FIG. 2 illustrates co-integrating different components in a microelectronic device (e.g., an inter die fabric architecture) in accordance with another embodiment. The microelectronic device 200 (e.g., an inter die fabric architecture 200) includes a substrate 220 and a package substrate 250 having at least one antenna unit 292. The substrate 220 (e.g., low resistivity silicon substrate having resistivity less than 1 ohm cm, etc.) includes digital circuitry, baseband circuitry, processors, application processors, and at least one transceiver unit. The substrate 220 also includes integrated or embedded compound semiconductor components 222-226 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.). The components 222-226 are integrated to the substrate 220 with semiconductor fabrication processes. For example, these components may be grown monolithically on the substrate 220. In another example, these components may be fabricated with a different process (e.g., GaAs, GaN, etc.) and then attached to the substrate 220 (or embedded within cavities of the substrate) at the beginning, during, or at the end of the processing for the substrate 220 (e.g., CMOS substrate 220) Integrated passive devices or dies (IPDs) 231-234 are coupled to the substrate 220 (or components 223-226) with connections 264-267 (e.g., bumps, Cu pillars with solder cap on top, etc.). The IPDs are assembled to the substrate 220 to enable RF front-end functionality as well as digital and analog functionalities. The IPDs may include any type of passives including inductors, transformers, capacitors, and resistors. In one example, capacitors on the IPD die may be used for power delivery. In another example, resistors on the same or a different IPD may be used for digital signal equalization. An overmolded component or module 230 (e.g., glass, high resistivity silicon, organic substrate, ceramic substrate, alumina substrate, compound semiconductor substrate, etc.) integrates the IPDs on the substrate 220. The component 230 may surround the IPDs completely (e.g., all sides, top, bottom) or may only partially surround (e.g., not above) the IPDs. Components of the substrate 220 including components 222-226 are coupled to the substrate 250 with connections 260-263 (e.g., thru mold connections). The substrate 250 includes at least one antenna unit 292, conductive layers 251, 254-259, and conductive connections 253, 254, and 256. The conductive layers 251, 255, 257, and 259 may each be antennas 251, 255, 257, and 259 of the antenna unit 292. The components of the substrate 220 and IPDs can communicate with components of the substrate 250 or other components not shown in FIG. 2 using secondary level interconnect 271 and 272. The connections 260-263 form primary level interconnect.

In one example, components of the substrate 250 which primarily dominate a packaging area are partitioned in a separate lower cost and lower circuit density substrate 250 in comparison to the substrate 220, which may have high density interconnect (HDI) and impedance controlled interconnect. A substrate 250 may be formed with low temperature co-fired ceramic materials, liquid crystal polymers, organic materials, glass, undoped silicon, etc. HDI PCB technologies may include blind and/or buried via processes and possibly microvias with a higher circuit density than traditional PCBs. In this manner, an area of the substrate 220 without antenna components is reduced to lower cost in comparison to a planar structure that includes antenna components. The substrate 220 may be formed with any materials (e.g., low resistivity silicon based substrates, materials for formation of CPUs, etc) that are designed for high frequency designs having desirable high frequency characteristics (e.g., substrate loss, dielectric constant).

In general, the IPDs are assembled to substrate 220 but in some cases the IPDs may be pre-molded prior to the assembly to the substrate 220 as illustrated in FIG. 2. If the substrate 220 is smaller than the IPD(s), then the substrate 220 may be assembled on the IPD(s) instead.

The substrate 250 can have a different thickness, length, and width dimensions in comparison to a thickness, length, and width dimensions of the substrate 220. In another embodiment, any of the devices or components can be coupled to each other.

Figure 3:
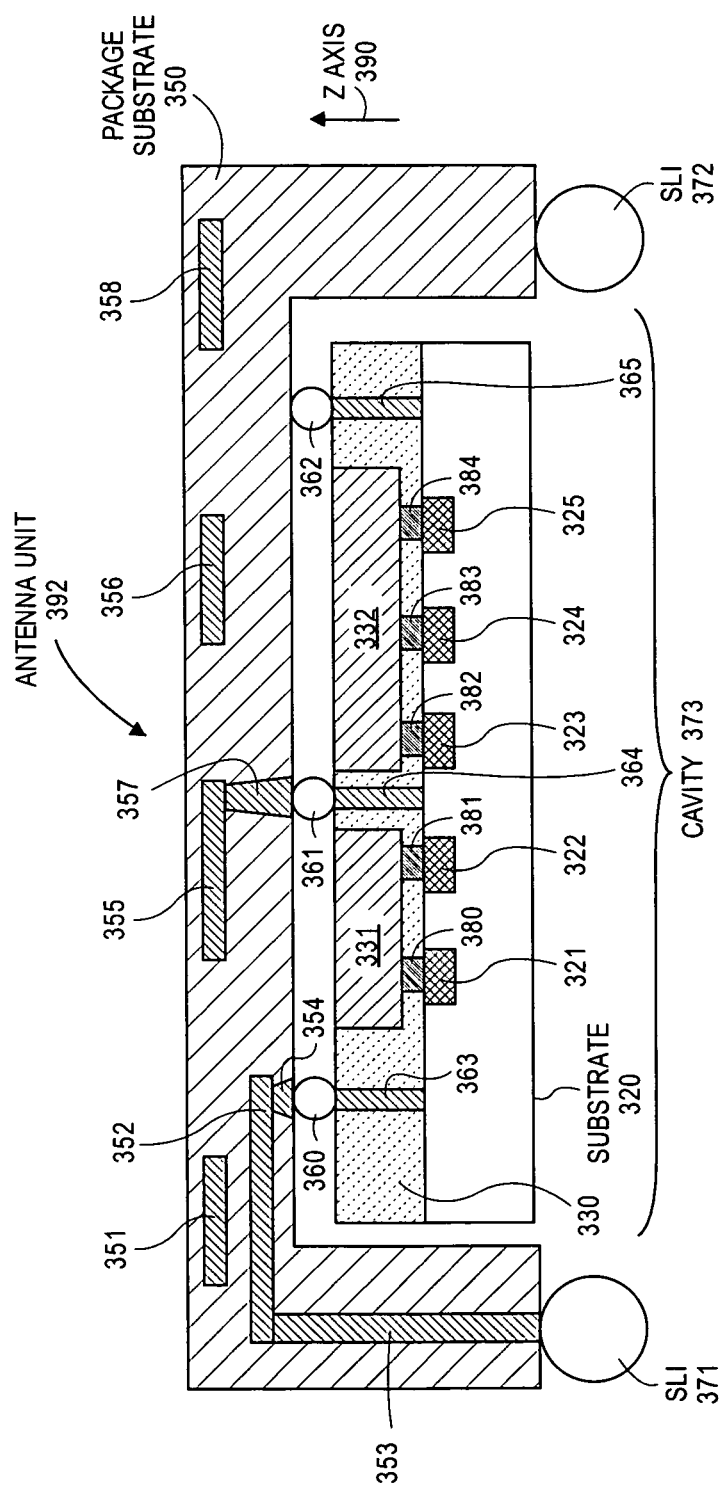
FIG. 3 illustrates co-integrating different components in a microelectronic device (e.g., an inter die fabric architecture) having a cavity in accordance with another embodiment.

FIG. 3 illustrates co-integrating different components in a microelectronic device (e.g., an inter die fabric architecture) having a cavity in accordance with another embodiment. The microelectronic device 300 (e.g., an inter die fabric architecture 300) includes a substrate 320 and a package substrate 350 having an antenna unit 392. The substrate 320 (e.g., low resistivity silicon substrate having resistivity less than 1 ohm cm, etc.) includes digital circuitry, baseband circuitry, processors, application processors, and at least one transceiver unit. The substrate 320 also includes integrated or embedded compound semiconductor components 321-325 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.). The components 321-325 are integrated to the substrate 320 with semiconductor fabrication processes. For example, these components may be grown monolithically on the substrate 320. In another example, these components may be fabricated with a different process (e.g., GaAs, GaN, etc.) and then attached to the substrate 320 (or embedded within cavities of the substrate) at the beginning, during, or at the end of the processing for the substrate 320 (e.g., CMOS substrate 320) Integrated passive devices or dies (IPDs) 331 and 332 are coupled to the substrate 320 (or components 321-325) with connections 380-384 (e.g., bumps, Cu pillars with solder cap on top, etc.). The IPDs are assembled to the substrate 320 to enable RF front-end functionality. The IPDs may include any type of passives including inductors, transformers, capacitors, and resistors. In one example, capacitors on the IPD die may be used for power delivery. In another example, resistors on the same or a different IPD may be used for digital signal equalization. An overmolded component 330 (e.g., glass, high resistivity silicon, organic substrate, ceramic substrate, alumina substrate, compound semiconductor substrate, etc.) integrates the IPDs on the substrate 320. The component 330 may surround the IPDs completely (e.g., all sides, top, bottom) or may only partially surround (e.g., not above) the IPDs. Components of the substrate 320 including components 321-325 are coupled to the substrate 350 with connections 363-365 (e.g., thru mold connections) and solder balls 360-362. The substrate 350 includes at least one antenna unit 392, conductive layers 351-353, 355, 356, 358, and conductive connections 353, 354, and 357. The conductive layers 351, 355, 356, and 358 may each be antennas 351, 355, 356, and 358, respectively, of the antenna unit 392. The components of the substrate 320 and IPDs 331 and 332 can communicate with components of the substrate 350 or other components not shown in FIG. 3 using secondary level interconnect 371 and 372. The connections 363-365 and 360-362 form primary level interconnect. The substrate 350 includes a cavity 373 that allows space for the substrate 320 and component 330 with IPDs 331 and 332. The cavity 373 allows a decrease in vertical height along a z axis 390 needed for assembly of the device 300. In this manner, a size, diameter, and height of the secondary level interconnect 371 and 372 are reduced in comparison to the secondary level interconnect 171 and 172 of FIG. 1.

In general, the IPDs are assembled to substrate 320 (e.g., SoC) but in some cases the IPDs may be pre-molded prior to the assembly to the substrate 320. If the substrate 320 is smaller than the IPD(s), then the substrate 320 may be assembled on the IPD(s) instead.

The substrate 350 can have a different thickness, length, and width dimensions in comparison to a thickness, length, and width dimensions of the substrate 320.

In another embodiment, any of the devices or components can be coupled to each other.

Figure 4:
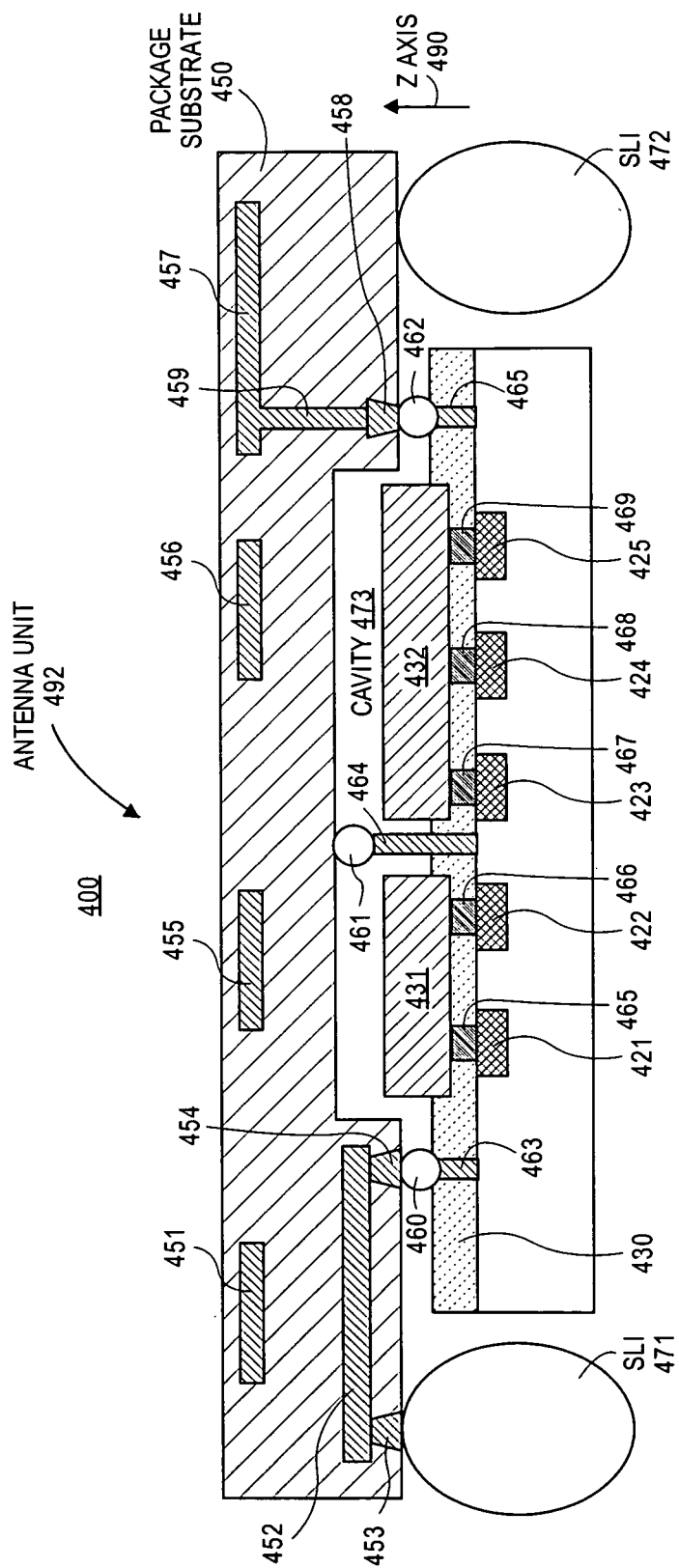
FIG. 4 illustrates co-integrating different components in a microelectronic device (e.g., an inter die fabric architecture) having a cavity in accordance with one embodiment.

FIG. 4 illustrates co-integrating different components in a microelectronic device (e.g., an inter die fabric architecture) having a cavity in accordance with one embodiment.

The microelectronic device 400 (e.g., an inter die fabric architecture 400) includes a substrate 420 and a package substrate 450 having an antenna unit 492. The substrate 420 (e.g., low resistivity silicon substrate having resistivity less than 1 ohm cm, etc.) includes digital circuitry, baseband circuitry, processors, application processors, and at least one transceiver unit. The substrate 420 also includes integrated or embedded compound semiconductor components 421-425 (e.g., GaN components, GaN devices, GaN circuitry, high output power transistors, RF circuitry, a combiner, a switch, power amplifier, individual devices (e.g., transistors), any type of device or circuitry formed in compound semiconductor materials, etc.). The components 421-425 are integrated to the substrate 420 with semiconductor fabrication processes. For example, these components may be grown monolithically on the substrate 420. In another example, these components may be fabricated with a different process (e.g., GaAs, GaN, etc.) and then attached to the substrate 420 (or embedded within cavities of the substrate) at the beginning, during, or at the end of the processing for the substrate 420 (e.g., CMOS substrate 420) Integrated passive devices or dies (IPDs) 431 and 432 are coupled to the substrate 420 (or components 421-425) with connections 465-469 (e.g., bumps, Cu pillars with solder cap on top, etc.). The IPDs are assembled to the substrate 420 to enable RF front-end functionality. The IPDs may include any type of passives including inductors, transformers, capacitors, and resistors. In one example, capacitors on the IPD die may be used for power delivery. In another example, resistors on the same or a different IPD may be used for digital signal equalization. An overmolded component 430 (e.g., glass, high resistivity silicon, organic substrate, ceramic substrate, alumina substrate, compound semiconductor substrate, etc.) integrates the IPDs on the substrate 420. The component 430 may surround the IPDs completely (e.g., all sides, top, bottom) or may only partially surround (e.g., not above) the IPDs. Components of the substrate 420 including components 421-425 are coupled to the substrate 450 with connections 463-465 (e.g., thru mold connections) and solder balls 460-462. The substrate 450 includes at least one antenna unit 492, conductive layers 451, 452, 455-457, 459, and conductive connections 453, 454, and 458. The conductive layers 451, 455, 456, and 457 may each be antennas 451, 452, 456, and 457, respectively, of the antenna unit 492. The components of the substrate 420 and IPDs 431 and 432 can communicate with components of the substrate 450 or other components not shown in FIG. 4 using secondary level interconnect 471 and 472. The connections 463-465 and solder balls 460-462 form primary level interconnect. The substrate 450 includes a cavity or recess 473 that allows space for the IPDs 431 and 432. The cavity 473 allows a decrease in vertical height along a z axis 490 needed for assembly of the device 400. In this manner, a size, diameter, and height of the secondary level interconnect 471 and 472 is reduced in comparison to the secondary level interconnect 171 and 172 of FIG. 1.

In general, the IPDs are assembled to substrate 420 (e.g., SoC) but in some cases the IPDs may be pre-molded prior to the assembly to the substrate 420. If the substrate 420 is smaller than the IPD(s), then the substrate 420 may be assembled on the IPD(s) instead.

The substrate 450 can have a different thickness, length, and width dimensions in comparison to a thickness, length, and width dimensions of the substrate 420.

In another embodiment, any of the devices or components can be coupled to each other.

In one example, compound semiconductor materials (e.g., GaN, GaAs, etc.) have significantly higher electron mobility in comparison to Silicon materials which allows faster operation. Compound semiconductor materials also have wider band gap, which allows operation of power devices at higher temperatures, and give lower thermal noise to low power devices at room temperature in comparison to Silicon materials. Compound semiconductor materials also have a direct band gap which provides more favorable optoelectronic properties than an indirect band gap of Silicon. Passives needed for passive matching networks are integrated in the IPDs, or passive power combiners or splitters can be assembled on the microelectronic device (e.g., an inter die fabric architecture). The components may be approximately drawn to scale or may not be necessarily drawn to scale depending on a particular architecture. In one example, for a frequency of approximately 30 GHz, a substrate (e.g., 150, 250, 350, 450) has dimensions of approximately 2.5 mm by 2.5 mm.

It will be appreciated that, in a system on a chip embodiment, the die may include a processor, memory, communications circuitry and the like. Though a single die is illustrated, there may be none, one or several dies included in the same region of the wafer.

In one embodiment, the microelectronic device may be a crystalline substrate formed using a bulk silicon or a silicon-on-insulator substructure. In other implementations, the microelectronics device may be formed using alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-V or group IV materials. Although a few examples of materials from which the substrate may be formed are described here, any material that may serve as a foundation upon which a semiconductor device may be built falls within the scope of embodiments of the present invention.

Figure 5:
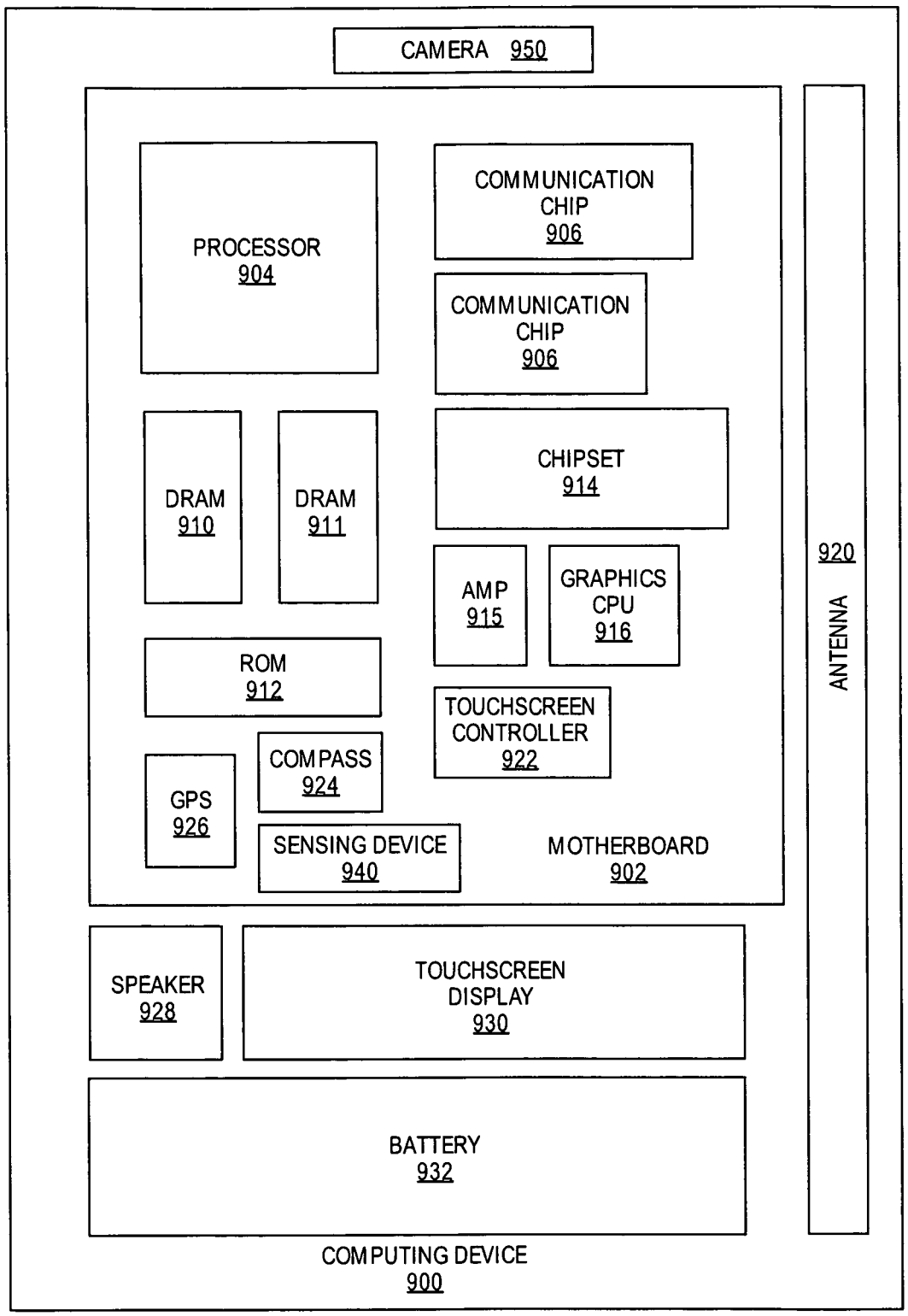
FIG. 5 illustrates a computing device 500 in accordance with one embodiment.

FIG. 5 illustrates a computing device 900 in accordance with one embodiment. The computing device 900 houses a board 902. The board (e.g., motherboard, printed circuit board, etc.) may include a number of components, including but not limited to at least one processor 904 and at least one communication chip 906. The at least one processor 904 is physically and electrically coupled to the board 902. In some implementations, the at least one communication chip 906 is also physically and electrically coupled to the board 902. In further implementations, the communication chip 906 is part of the processor 904. In one example, the communication chip 906 (e.g., microelectronic device 100, 200, 300, 400, etc.) includes an antenna unit 920 (e.g., antenna unit 192, 292, 392, 492, etc.).

Depending on its applications, computing device 900 may include other components that may or may not be physically and electrically coupled to the board 902. These other components include, but are not limited to, volatile memory (e.g., DRAM 910, 911), non-volatile memory (e.g., ROM 912), flash memory, a graphics processor 916, a digital signal processor, a crypto processor, a chipset 914, an antenna unit 920, a display, a touchscreen display 930, a touchscreen controller 922, a battery 932, an audio codec, a video codec, a power amplifier 915, a global positioning system (GPS) device 926, a compass 924, a gyroscope, a speaker, a camera 950, and a mass storage device (such as hard disk drive, compact disk (CD), digital versatile disk (DVD), and so forth).

The communication chip 906 enables wireless communications for the transfer of data to and from the computing device 900. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 906 may implement any of a number of wireless standards or protocols, including but not limited to Wi-Fi (IEEE 802.11 family), WiMAX (IEEE 802.16 family), WiGig, IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 900 may include a plurality of communication chips 906. For instance, a first communication chip 906 may be dedicated to shorter range wireless communications such as Wi-Fi, WiGig, and Bluetooth and a second communication chip 906 may be dedicated to longer range wireless communications such as GPS, EDGE, GPRS, CDMA, WiMAX, LTE, Ev-DO, 5G, and others.

The at least one processor 904 of the computing device 900 includes an integrated circuit die packaged within the at least one processor 904. In some embodiments of the invention, the integrated circuit die of the processor includes one or more devices, such as microelectronic devices (e.g., microelectronic device 100, 200, 300, 400, 500, etc.) in accordance with implementations of embodiments of the invention. The term "processor" may refer to any device or portion of a device that processes electronic data from registers and/or memory to transform that electronic data into other electronic data that may be stored in registers and/or memory.

The communication chip 906 also includes an integrated circuit die packaged within the communication chip 906. In accordance with another implementation of embodiments of the invention, the integrated circuit die of the communication chip includes one or more microelectronic devices (e.g., microelectronic device 100, 200, 300, 400, etc.).

The following examples pertain to further embodiments. Example 1 is a microelectronic device that includes a first silicon based substrate having compound semiconductor components and a second substrate that is coupled to the first substrate. The second substrate includes an antenna unit for transmitting and receiving communications at a frequency of approximately 4 GHz or higher (e.g., at least 4 GHz, at least 15 GHz, at least 25 GHz). In one example, the first substrate includes a transceiver unit and a baseband unit.

In example 2, the subject matter of example 1 can optionally include an integrated passive die (IPD) that is coupled to at least one of the first and second substrates. The IPD includes passives for passive matching networks, power supply, digital signal equalization, filtering, etc. . . .

In example 3, the subject matter of any of examples 1-2 can optionally include an overmolded component that at least partially surrounds the at least one IPD. The overmolded component integrates the at least IPD with the first substrate.

In example 4, the subject matter of any of examples 1-3 can optionally include at least one thru mold connection formed in the overmolded component to provide at least one electrical connection between the first substrate and the second substrate.

In example 5, the subject matter of example 4 can optionally include the compound semiconductor components including at least one of devices, high output power transistors, and RF circuitry formed with compound semiconductor materials.

In example 6, the subject matter of any of examples 1-5 can optionally include the compound semiconductor components including at least one of devices and circuitry formed with GaN materials.

In example 7, the subject matter of any of examples 1-6 can optionally include the microelectronic device being a 5G package architecture for 5G communications.

In example 8, a microelectronic device includes a first silicon based substrate having compound semiconductor components and a second substrate having a cavity for positioning of the first silicon based substrate within the cavity. The second substrate includes an antenna unit for transmitting and receiving communications at a frequency of approximately 15 GHz or higher (e.g., at least 4 GHz, at least 15 GHz, at least 25 GHz).

In example 9, the subject matter of example 8 can optionally include an integrated passive die (IPD) that is coupled to at least one of the first and second substrates. The IPD includes passives for passive matching networks.

In example 10, the subject matter of any of examples 8-9 can optionally include an overmolded component that at least partially surrounds the at least one IPD. The overmolded component integrates the at least IPD with the first substrate.

In example 11, the subject matter of any of examples 8-10 can optionally include at least one thru mold connection formed in the overmolded component to provide at least one electrical connection between the first substrate and the second substrate.

In example 12, the subject matter of example 11 can optionally include the compound semiconductor components including at least one of devices, high output power transistors, and RF circuitry formed with compound semiconductor materials.

In example 13, the subject matter of any of examples 8-12 can optionally include the compound semiconductor components including at least one of devices and circuitry formed with GaN materials.

In example 14, the subject matter of any of examples 8-13 can optionally include the microelectronic device being a 5G package architecture for 5G communications.

Example 15 is a computing device that includes at least one processor to process data and a communication module or chip that is coupled to the at least one processor. The communication module or chip includes a first silicon based substrate having compound semiconductor components and a second substrate coupled to the first silicon based substrate. The second substrate having a cavity and an antenna unit for transmitting and receiving communications at a frequency of approximately 15 GHz or higher.

In example 16, the subject matter of example 15 can optionally include the computing device further including at least one integrated passive die (IPD) coupled to at least one of the first and second substrates. The IPD is positioned at least partially within the cavity of the second substrate.

In example 17, the subject matter of any of examples 15-16 can optionally include the computing device further comprising an overmolded component at least partially surrounding the at least one IPD. The overmolded component to integrate the at least IPD with the first substrate.

In example 18, the subject matter of any of examples 15-17 can optionally include at least one thru mold connection formed in the overmolded component to provide at least one electrical connection between the first substrate and the second substrate.

In example 19, the subject matter of any of examples 15-18 can optionally include the compound semiconductor components including at least one of devices, high output power transistors, and RF circuitry formed with compound semiconductor materials.

In example 20, the subject matter of any of examples 15-19 can optionally include the compound semiconductor components include at least one of devices and circuitry formed with GaN materials.

What is claimed is:

1. A microelectronic device comprising:
   a first silicon semiconductor substrate having cavities therein, the first silicon semiconductor substrate having compound semiconductor components embedded in the cavities therein, the first silicon semiconductor substrate having low resistivity silicon based digital circuitry, and the first silicon semiconductor substrate having a footprint;
   a second substrate coupled to the first silicon semiconductor substrate, the second substrate including an antenna unit for transmitting and receiving communications at a frequency of approximately 4 GHz or higher; and
   a plurality of interconnects coupled directly to the second substrate, wherein one or more of the plurality of interconnects are outside of the footprint of the first silicon semiconductor substrate.

2. The microelectronic device of claim 1 further comprising:
   at least one integrated passive die (IPD) coupled to at least one of the first and second substrates, the IPD includes passives for passive matching networks.

3. The microelectronic device of claim 2, further comprising:
   an overmolded component at least partially surrounding the at least one IPD, the overmolded component to integrate the at least IPD with the first silicon semiconductor substrate.

4. The microelectronic device of claim 3, further comprising:
   at least one thru mold connection formed in the overmolded component to provide at least one electrical connection between the first silicon semiconductor substrate and the second substrate.

5. The microelectronic device of claim 1 wherein the compound semiconductor components include at least one of devices, high output power transistors, and RF circuitry formed with compound semiconductor materials.

6. The microelectronic device of claim 5, wherein the compound semiconductor components include at least one of devices and circuitry formed with GaN materials.

7. The microelectronic device of claim 1, wherein the microelectronic device comprises a 5G package architecture for 5G communications.

8. A microelectronic device comprising:
   a first silicon semiconductor substrate having cavities therein, the first silicon semiconductor substrate having compound semiconductor components embedded in the cavities therein, the first silicon semiconductor substrate having low resistivity silicon based digital circuitry, and the first silicon semiconductor substrate having a footprint;
   a second substrate having a cavity for positioning of the first silicon semiconductor substrate within the cavity, the second substrate includes an antenna unit for transmitting and receiving communications at a frequency of approximately 15 GHz or higher; and
   a plurality of interconnects coupled directly to the second substrate, wherein one or more of the plurality of interconnects are outside of the footprint of the first silicon semiconductor substrate.

9. The microelectronic device of claim 8 further comprising:
   at least one integrated passive die (IPD) coupled to at least one of the first and second substrates, the IPD includes passives for passive matching networks.

10. The microelectronic device of claim 9, further comprising:
    an overmolded component at least partially surrounding the at least one IPD, the overmolded component to integrate the at least IPD with the first silicon semiconductor substrate.

11. The microelectronic device of claim 10, further comprising:
    at least one thru mold connection formed in the overmolded component to provide at least one electrical connection between the first silicon semiconductor substrate and the second substrate.

12. The microelectronic device of claim 8 wherein the compound semiconductor components include at least one of devices, high output power transistors, and RF circuitry formed with compound semiconductor materials.

13. The microelectronic device of claim 12, wherein the compound semiconductor components include at least one of devices and circuitry formed with GaN materials.

14. The microelectronic device of claim 8, wherein the microelectronic device comprises a 5G package architecture for 5G communications.

\* \* \* \* \*